United States Patent [19]
Choi et al.

[11] Patent Number: 5,650,956
[45] Date of Patent: Jul. 22, 1997

[54] CURRENT AMPLIFICATION TYPE MASK-ROM

[75] Inventors: Jung-Dal Choi; Sung-Bu Jun; Byeung-Chul Kim, all of Suwon, Rep. of Korea

[73] Assignee: Samsung Electronics Co., Ltd., Swon, Rep. of Korea

[21] Appl. No.: 513,384

[22] Filed: Aug. 11, 1995

[30] Foreign Application Priority Data

Aug. 17, 1994 [KR] Rep. of Korea ............... 20294/1994

[51] Int. Cl.⁶ .................................................. G11C 11/34
[52] U.S. Cl. .................. 365/104; 365/177; 257/378; 257/390
[58] Field of Search .......................... 365/104, 94, 177, 365/185.17; 257/370, 378, 390

[56] References Cited

U.S. PATENT DOCUMENTS

| | | | |
|---|---|---|---|
| 5,444,654 | 8/1995 | Hara | 365/177 |
| 5,483,483 | 1/1996 | Choi | 365/177 |

*Primary Examiner*—David C. Nelms
*Assistant Examiner*—Son Mai
*Attorney, Agent, or Firm*—Cushman Darby & Cushman, IP Group of Pillsbury Madison & Sutro LLP

[57] ABSTRACT

A current amplification type mask-ROM having a bipolar junction transistor. The current amplification type mask-ROM includes a collector grounding part disposed in each of the plurality of bipolar junction transistors one by one, and a ground line for connecting the collector grounding part to a cell grounding part formed in one end of a cell array.

9 Claims, 16 Drawing Sheets

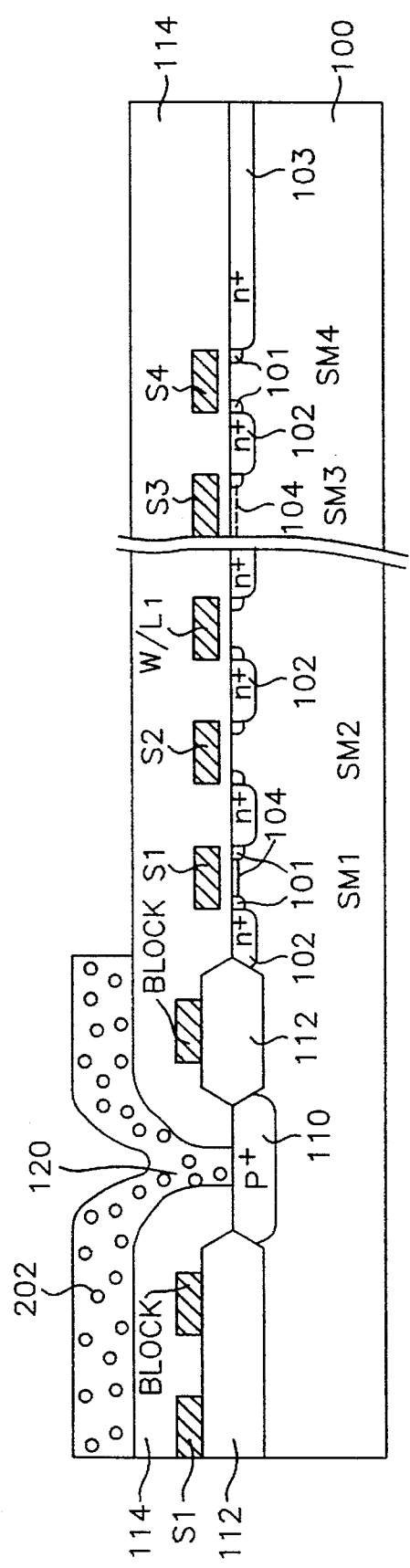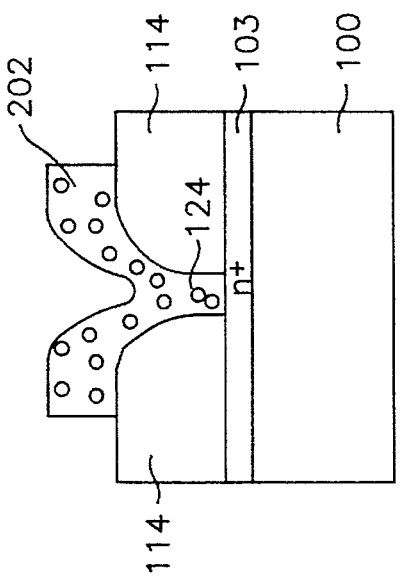
FIG. 8A
FIG. 8B

CURRENT AMPLIFICATION TYPE MASK-ROM

BACKGROUND OF THE INVENTION

The present invention relates to a semiconductor memory device, and more particularly to a current amplification type mask-ROM having a bipolar junction transistor.

The structures of cells of mask-ROMs are generally divided into a NOR type and a NAND type. The mask-ROMs corresponding to a grade 4 Mb and a grade 16 Mb are employing the NAND type memory cell structure which is advantageous to high integration density.

FIG. 1 is an equivalent circuit view illustrating a part of the cell array of a general NAND type mask-ROM.

In the cell of the general NAND type mask-ROM, a plurality of string select transistors (M1 and M3: M2 and M4) which use the first and second string select lines S1 and S2 as their gate electrodes, are connected to a plurality of cell transistors M5, M7, . . . , $M_{N-1}$; M6, M, . . . , $M_N$, thereby each forming the first and second string lines R1 and R2. Further, the first and second string lines R1 and R2 are connected in parallel to a bit line B/L in the cell of the general NAND mask-ROM, thereby forming a basic unit of a memory cell array. At this time, within one string line, a plurality of enhancement type cell transistors are connected to a plurality of depletion type cell transistors through an impurity diffusion layer. In FIG. 1, a reference numeral "D" indicates the depletion type transistor and the rest of transistors are the enhancement type transistors.

The operation of the mask-ROM is as follows.

First, during the stand-by operation, 0 volt is provided to the string select lines S1 and S2 and the common power supply voltage Vcc is provided to the word lines W/L1, W/L2, . . . , $W/L_N$, thereby floating the bit line.

Second, during the read mode operation, 0 volt (or the power supply voltage Vcc) is provided to the first string select line S1 and the power supply voltage Vcc (or 0 volt) is provided to the second string select line S2, thereby selecting the first string line R1 (or the second string line R2). Thereafter, all of the unselected unit transistors of the unit cell transistors constituting the selected string line are turned on, and 0 volt is applied to the gate electrode of the selected transistor to thereby recognize whether the selected transistor is the enhancement type one or the depletion type one. This recognition results in reading data stored in the memory cell.

However, as the integration density is increased or as the number of unit cell transistors connected serially in the one string line is increased, the memory cell current of the NAND type mask-ROM becomes lower. Thereby, there are provided some problems in that it is difficult to read data and in that the data read speed becomes slow. As the operating voltage of the memory device becomes low, such a problem becomes more serious.

In order to improve the problems of the general NAND type mask-ROM, a new NAND mask-ROM is proposed, which has been referred to a Korean Patent Application No. 93-03299 (Tile of the Invention: A Semiconductor Memory Device, Inventors: Choi Jeong-Dal and Seo Kang-deok, Applicant: SAMSUNG Co., Ltd., Filing Date: 5 Mar. 1993) which corresponds to U.S. patent application Ser. No. 08/206,824, filed Mar. 7, 1994.

FIG. 2 shows a layout of the cell array of the prior art NAND type mask-ROM disclosed in the Korean Paten Application No. 93-03299.

In FIG. 2, a vertically long area taken along a long dot line is a mask pattern P1 for forming an $N^+$ impurity diffusion layer. A horizontally long area taken along one dot and dash line is a mask pattern P2 for forming the string select line and the gate electrode of the cell transistor. A vertically long area taken along two dots and dash line is a mask pattern P3 for forming the bit line. A squared-shaped area taken along a short dot line is a mask pattern P4 for forming a depletion type channel. A squared-shaped area having oblique lines tilted to the right therein is a mask pattern P5 for forming a base of the bipolar junction transistor (hereinafter, referred to as "BJT"). Squared-shaped areas having oblique lines tilted to the left therein are mask patterns P6 and P7 for forming an emitter of the "BJT" and a $P^+$ion-implantation area. Squared-shaped areas having many dots therein are mask patterns P8 and P9 for forming contact windows. One contact window connects the emitter to the bit line and the other contact window connects the $P^+$ion-implantation area to a ground line. And, a mask pattern P10 taken along a solid line includes the mask pattern P9 and is used for forming the ground line.

FIG. 3 is the equivalent circuit view illustrating the NAND type mask-ROM of FIG. 2.

Referring to FIG. 3, there are repeatedly formed in the cell array part unit circuits having a BJT and two string lines R1 and R2 which are composed of the first and second string select transistors SM1 and SM2 and cell transistors M1, M2, M3, . . . , $M_{N-1}$, $M_N$, the BJT and the two string lines R1 and R2 being connected in parallel to each other. The emitters of the BJTs are connected to the bit lines B/L, the bases thereof to the drains of the first string select transistor SM1, and the collector thereof to the ground of the well (not shown) formed on the semiconductor substrate. The above first and second string select transistors SM1 and SM2 use the first and second string select lines S1 and S2 as their gate electrodes, and the above cell transistors M1, M2, M3, . . . , $M_{N-1}$, $M_N$ use a plurality of word lines W/L1, W/L2, W/L3, . . . , $W/L_{N-1}$, $W/L_N$ as their gate electrodes. Also, a plurality of ground lines for grounding the unit circuits are formed in the unit circuit one by one.

The equivalent circuit of FIG. 3 is the same as the mask-ROM of FIG. 1 except that the BJT is formed between the drain of the first string select transistor SM1 and the bit line B/L.

The BJT formed in between the drain of the first string select transistor SM1 and the bit line B/L increases the current flowing into the BJT from the bit line by β when its current gain is β. Thus, it is easy to read data generated due to reduction of the cell current and the time in reading the data becomes short.

FIGS. 4A and 4B are cross sectional views taken along the lines IV—IV and IV'—IV' of FIG. 2.

Referring to FIGS. 2, 3, 4A and 4B, the structure of the prior art NAND type mask-ROM will be explained hereinafter.

The prior art NAND type mask-ROM is composed of a P-type well 12; the string select lines S1 and S2 and the word lines W/L1, W/L2, W/L3, . . . , $W/L_N$; an $N^+$-type impurity diffusion layer 14; a depletion channel 16; an $N^-$-type impurity diffusion layer 18; a $p^+$-type impurity diffusion layer 20; a $p^+$ ion-implantation layer 22; contact windows 25 and 27; a bit line 26; and a ground line 28. The p-type well 12 is formed on a P-type (or N-type) semiconductor substrate 10. The string select lines S1 and S2 and the word lines W/L1, W/L2, W/L3, . . . , $W/L_N$, are formed on the semiconductor substrate by using the mask pattern P2. The N⁺-type impurity diffusion layer 14 is formed around the surface of the semiconductor substrate between the lines by the mask pattern P1 to thus become the source/drain region of each transistor. The depletion channel 16 is formed by impurity ion-implantation method using the mask pattern P4 to thus constitute the depletion type transistor D. The N⁻-type impurity diffusion layer 18 is formed by using the mask pattern P5 to each become the drain region of the first sting select transistor SM1 and the base of the BJT. The p⁺-type impurity diffusion layer 20 is formed by using the mask pattern P6 to thus become the emitter of the BJT. The p⁺ ion-implantation layer 22 is formed by using the mask pattern P7. The contact window 25 is formed by using the mask pattern P8 and connects the p⁺-type impurity diffusion layer 20 to the bit line. The contact window 27 is formed by using the mask pattern P9 and connects the p⁺ ion-implantation layer 22 to the ground line. The bit line 26 is formed by using the mask pattern P3 for contacting with the P⁺ impurity diffusion layer 20. And, the ground line 28 is formed by using the mask pattern P10 for contacting with the P⁺ ion-implantation layer 22.

With respect to FIG. 3, the BJT uses the p⁺ impurity diffusion layer 20 as its emitter E, the N⁻-type impurity diffusion layer 18 as its base B, and the p-type well 12 as its collector C. The well 12 is formed over the semiconductor substrate to thereby connect the collector to the ground line 28.

According to the Korean Patent Application No. 93-03299, the BJT is formed in between the drain region 20 of the string select transistor SM1 and the bit line 26. Here, the drain region 20 of the string select transistor SM1 becomes the base of the BJT and the bit line becomes the emitter thereof, so that it is possible to increase the cell current by β times as large as the gain current of the BJT. Thus, it is easy to read data caused in the mask-ROM being on trend of the high integration density and the time in reading data becomes short.

However, in case that a plurality of "ON" cells are selected in the cell array to thereby activate the plurality of BJTs, a great deal of holes flow into the p-type well 12, so that the potential of the p-type well rises more than the built-in potential. Thereby, a P-N-P-N diode (which is composed of the P⁺-type impurity diffusion layer 20—the N⁻-type impurity diffusion layer 18—the P-type well 12—the N⁺-type impurity diffusion layer 14) is turned on and a great deal of current flow thus into the N⁺-type impurity diffusion layer 14 which is connected to the ground line 28 in the P⁺-type impurity diffusion layer 20 being the emitter of the BJT. This results in a malfunction and a latch-up in the cell. Further, owing to the rise of the potential of the P-type well, leakage current of the "OFF" cell causing the malfunction in the cell is increased and the bulk threshold voltage $V_{TH}$ is also reduced.

As the interval between the P⁺-type impurity diffusion layer 20 and the P⁺ ion-implantation layer 22 for grounding the P-type well 12 becomes large, such a problem becomes more serious. Further, as the interval between the P⁺-type impurity diffusion layer 20 and the P⁺ ion-implantation layer 22 becomes large, the parasite resist $R_{WELL}$ is increased in proportion to the size of the interval therebetween. As a result, the potential of the P-type well 12 rises because the holes flowing into the P-type well 12 are not effectively grounded.

SUMMARY OF THE INVENTION

It is therefore object of the present invention to provide a current amplification type mask-ROM capable of solving problems caused due to the rise of the bulk potential in a semiconductor memory device for improving the cell current amplification by using a bipolar junction transistor.

The object of the present invention is achieved by the current amplification type mask-ROM which has a collector grounding part of the bipolar junction transistor disposed in each of the plurality of bipolar junction transistors one by one, and a ground line for connecting the collector grounding part to a cell grounding part formed in one end of a cell array.

At the moment, the collector grounding part is conducted as the equal type to the collector of the bipolar junction transistor. The cell grounding part is conducted as the equal type to the source/drain of the cell transistor. Probably, the thickness of impurity of the collector grounding part is higher than that of impurity of the collector.

According to one preferred embodiment, the cell grounding part conducted as the equal type to the source/drain of the cell transistor, partially includes an impurity area which is conducted as the equal type to the collector of the bipolar junction transistor and is also connected to the ground line.

According to the other preferred embodiment, the collector grounding part is similar to the base of the bipolar junction transistor in its size. More preferably, an impurity layer of low thickness is formed in between the collector grounding part and the base of the bipolar junction transistor, the impurity layer being conducted as the equal type to the base thereof.

According to another preferred embodiment, the collector grounding part is lengthened along the grounding line. At this time, the collector grounding part includes a part of the depletion channel of the cell transistor.

In the mask-ROM mentioned above, the bipolar junction transistor is a PNP-type one and the cell transistor is an NMOS-type one. The source/drain of the cell transistor is formed by a configuration LDD (Lightly Doped Drain).

In accordance with the semiconductor memory device of the present invention, the collector grounding part for grounding the collector of the BJT and the P-type well is formed around the BJT, and the cell grounding part for grounding the source/drain of the cell transistor is formed in the one side of the cell array. Thereafter, the two grounding parts are connected to each other through one ground line, so that it is possible to effectively ground a great deal of holes flowing into the p-type well (or p-type semiconductor substrate) during the read operation of the "ON" cell. Accordingly, it is possible to suppress the rise of the potential of the p-type well and the aforementioned problems can therefore, be solved.

BRIEF DESCRIPTION OF THE DRAWINGS

The above and other objects, advantages and features of the present invention will be more apparent from the following detailed description taken with the attached drawings in which:

FIGS. 8A and 8B are cross sectional views taken along the lines VIII—VIII and VIII'—VIII' of FIG. 5;

DETAILED DESCRIPTION OF THE PREFERRED EMBODIMENT

First Embodiment

Figure 5:
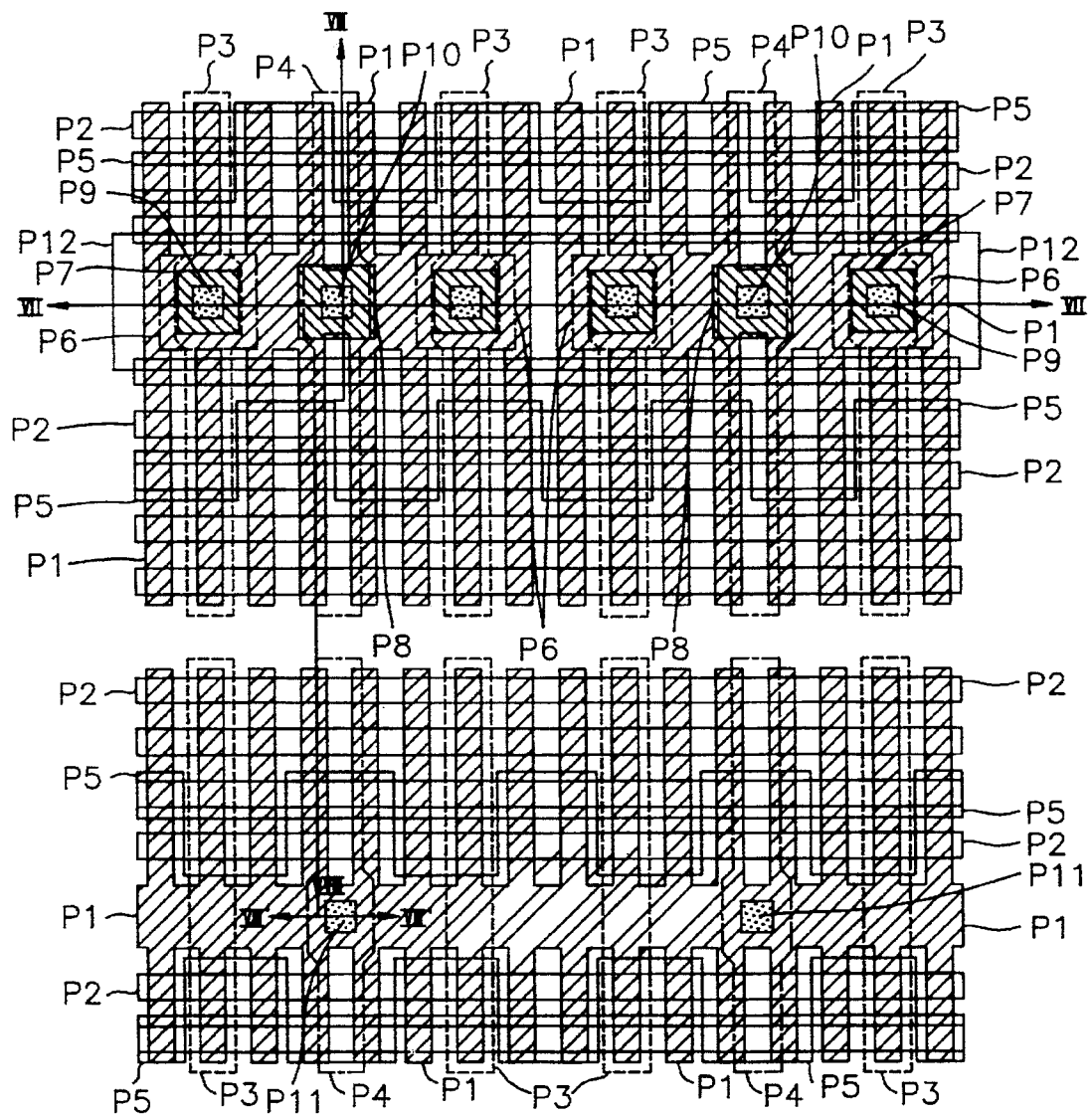
FIG. 5 shows a layout of the cell array of the NAND type mask-ROM according to a first embodiment of the present invention.

FIG. 5 shows a layout of the cell array of the NAND type mask-ROM according to a first embodiment of the present invention.

In FIG. 5, a vertically long square having oblique lines tilted to the right therein is a mask pattern P1 for forming a source/drain of the a cell transistor. A horizontally long square taken along a solid line is a mask pattern P2 for forming a string select line, a block select line, and a gate electrode of the cell transistor. A vertically long square taken along a dot line is a mask pattern P3 for forming a bit line. A vertically long square taken along one dot and dash line is a mask pattern P4 for forming a ground line. A horizontally long square taken along a short dot line is a mask pattern P5 for forming a depletion channel. A squared-shaped area taken along one dot and dash line is a mask pattern P6 for forming a base of the BJT. Squares having oblique lines tilted to the left therein, are mask patterns P7 and P8 for forming an emitter of the BJT and a $P^+$ collector grounding part. Squares having many dots therein, are mask patterns P9, P10, and P11 for forming contact windows. The contact windows connect the emitter of the BJT to the bit line, the $P^+$ collector grounding part to the ground line, and the source/drain to the ground line, respectively. A horizontally long mask pattern P12 having the mask patterns P6, P7, P9, and P10 therein, is used for forming an $N^+$ ion-implantation preventing layer for the $N^+$ ion-implantation during forming an $N^+$ source/drain.

Figure 6:
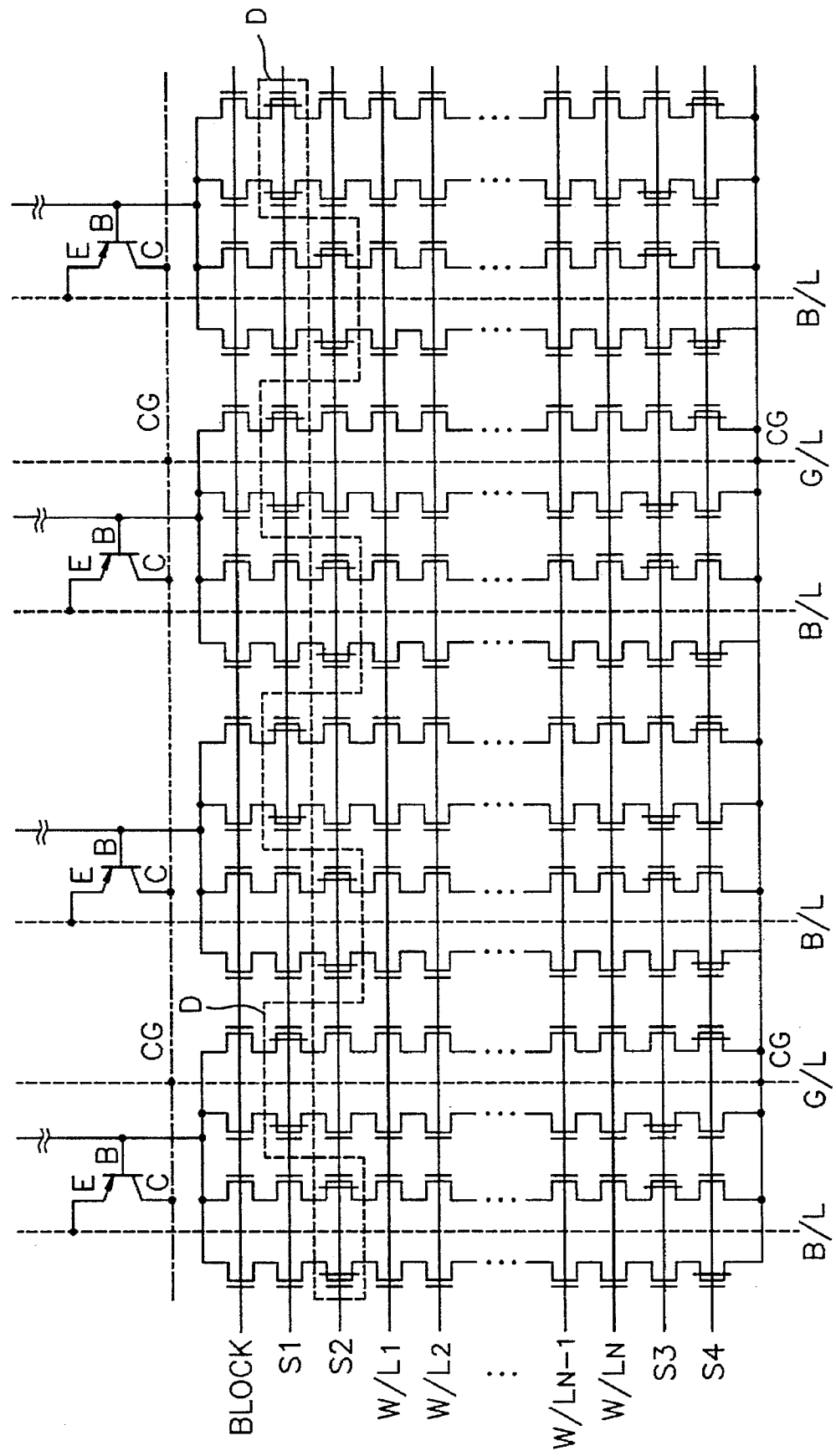
FIG. 6 is an equivalent circuit view of the NAND type mask-ROM of FIG. 5.

FIG. 6 is the equivalent circuit view of the NAND type mask-ROM of FIG. 5.

Figure 1:
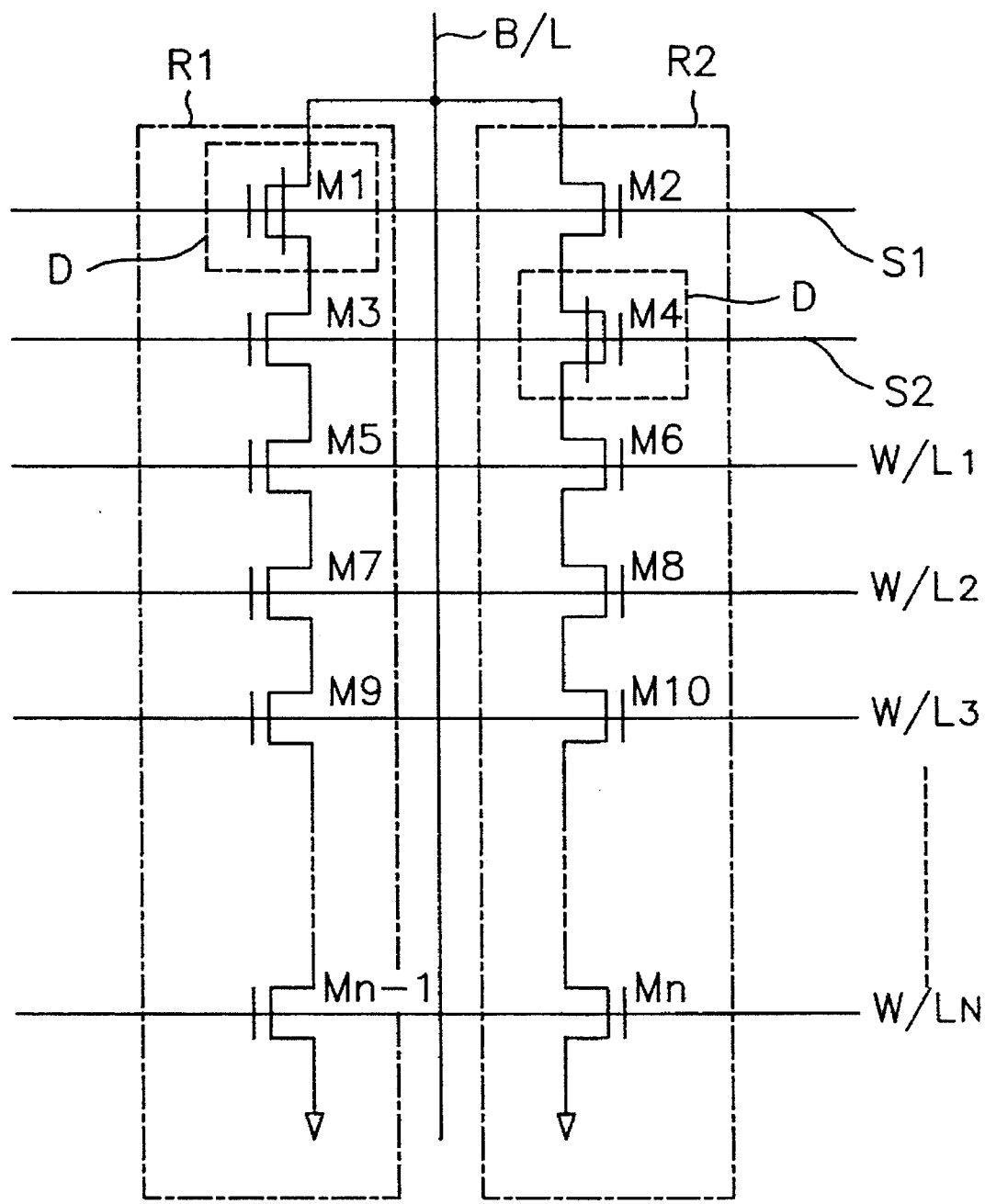
FIG. 1 is an equivalent circuit view showing a part of a cell array of a general NAND type mask-ROM.
Figure 2:
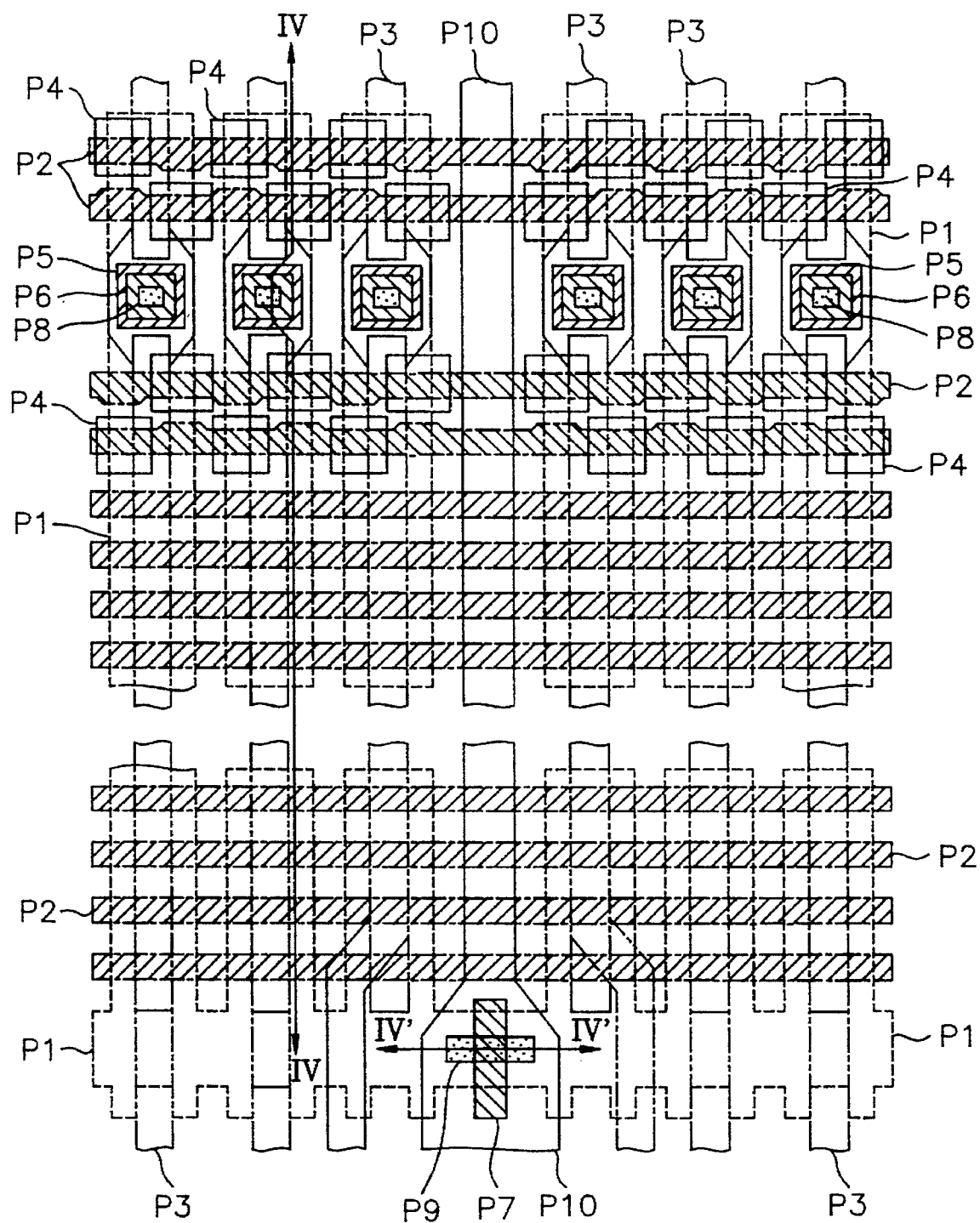
FIG. 2 shows a layout of the cell array of a prior art NAND type mask-ROM.
Figure 3:
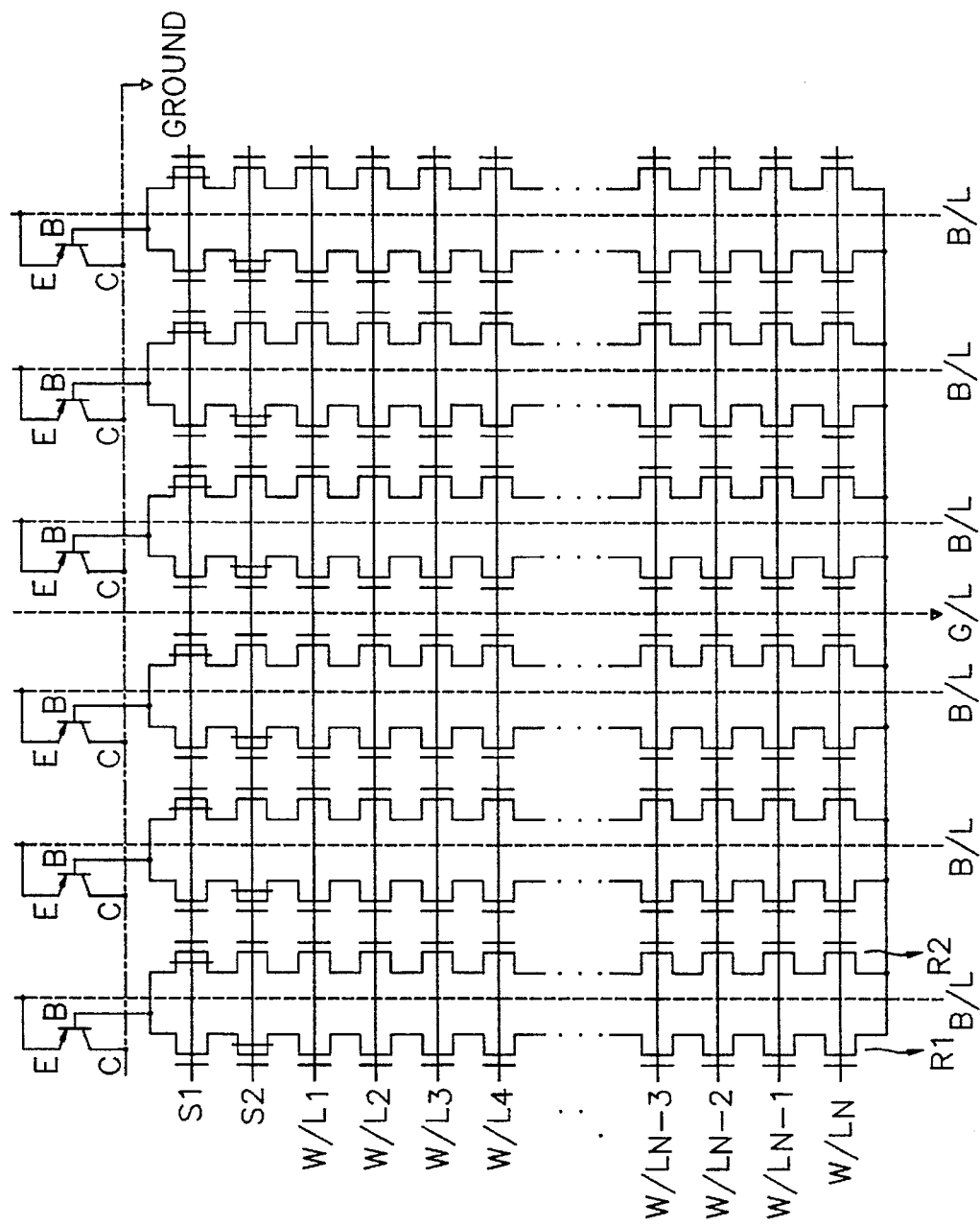
FIG. 3 is an equivalent circuit view of the NAND type mask-ROM of FIG. 2.

In the equivalent circuit view of FIG. 3, the BJTs are connected to two strings one by one, and only one grounding part is included in all over the cell array. However, in the equivalent circuit view of FIG. 6, the BJTs are connected to the four strings one by one, and each of the collector grounding part is adjacently formed to the BJT every two BJTs. This collector grounding part is also connected to the cell grounding part formed in one end of the cell array through the same ground line.

In reference numerals of FIG. 6, the same ones as those of FIG. 3 indicate the same part in drawings. A character "BLOCK" indicates a block select line and the other character "CG" indicates a cell grounding part. Also, a reference numeral "S3" indicates a third string select line and the other reference numeral "S4" indicates a fourth string select line.

Figure 7:
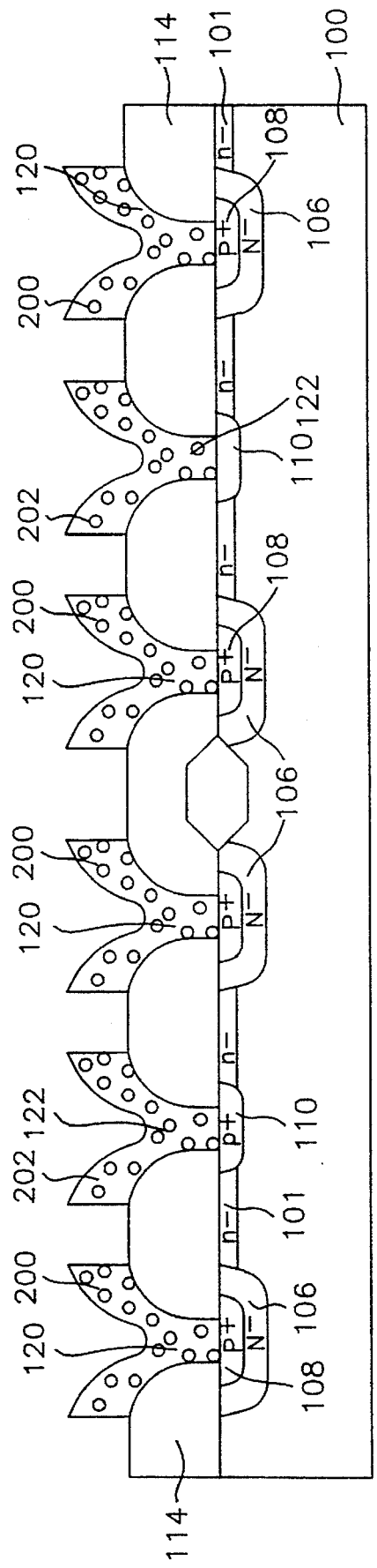
FIG. 7 is a cross sectional view taken along the line VII—VII of FIG. 5.

FIG. 7 is the cross sectional view taken along the line VII—VII of FIG. 5.

FIGS. 8A and 8B are sectional views taken along the lines VIII—VIII and VIII'—VIII' of FIG. 5.

Referring to FIGS. 5, 6, 7, 8A, and 8B, the structure of the NAND type mask-ROM according to the first embodiment of the present invention will be explained hereinafter.

The NAND type mask-ROM according to the present invention uses, as the ion-implantation preventing mask, the block select line BLOCK, the string select lines S1, S2, S3, and S4, the word lines W/L1, W/L2, . . . , W/L$_N$ which are formed on the P-type well or the P-type semiconductor substrate 100 by using the mask pattern P2. Also, the NAND type mask-ROM according to the present invention is comprised of the $N^-$-type impurity-implantation layer 101, a source/drain region 102 of the cell transistor, a depletion channel 104, an $N^-$-type base 106 of the BJT, a $P^+$-type emitter 108 of the BJT, the P-type well or the P-type semiconductor substrate, the P+ collector grounding part 110, contact windows 120, 122, and 124, a bit line 200, and a ground line 202. In the more detailed explanation on the structure of the NAND type mask-ROM according to the present invention, the $N^-$-type impurity-implantation layer 101 is formed in between the lines of the area limited by the mask pattern P1. The source/drain 102 of the cell transistor is formed in one area from which the other area limited by the mask pattern P12 is removed among the areas limited by the mask pattern P1. The depletion channel 104 is formed by impurity ion-implantation method using the mask pattern P5 for constituting the depletion type transistor D. The $N^-$-type base of the BJT is formed by ion-implantation method using the mask pattern P6. The $P^+$-type emitter 108 of the BJT is formed by impurity ion-implantation method using the mask pattern P7. The P-type well or the P-type semiconductor substrate is formed by impurity ion-implantation method using the mask pattern P8 and is also connected to the ground line 202. The $P^+$ collector grounding part 110 grounds the collector of the BJT. The contact window 120 connects the $p^+$-type emitter 108 to the bit line 200. The contact window 122 connects the $p^+$-type collector grounding part 110 to the ground line 202. The contact window 124 connects an $N^+$ cell grounding part 103 becoming a drain of the fourth string select transistor SM4 to the ground line 202. The ground line 202 is connected to the $P^+$ collector grounding part 110. And, the ground line 202 connects the $P^+$ collector grounding part 110 to the $N^+$ cell grounding part 103. Here, a reference numeral 112 indicates a field oxide film for electrically insulating each string, and a reference numeral 114 indicates a layer insulating film.

In FIG. 7, the $P^+$-type emitter 108, the $N^-$-type base 106, P-type well correspond to the emitter, the base, and the collector of the BJT, respectively. The collector is connected to the $P^+$ collector grounding part 110.

Figure 4A:
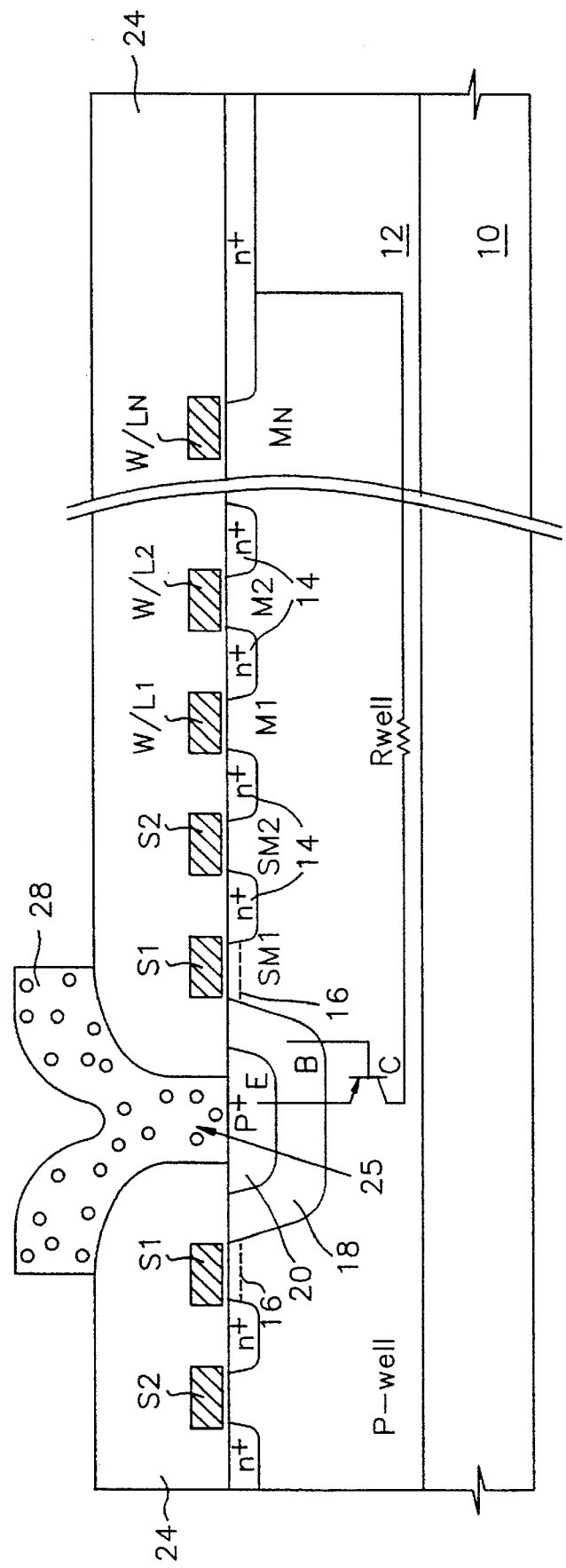
FIGS. 4A and 4B are cross sectional views taken along lines IV—IV and IV'—IV' of FIG. 2.
Figure 4B:
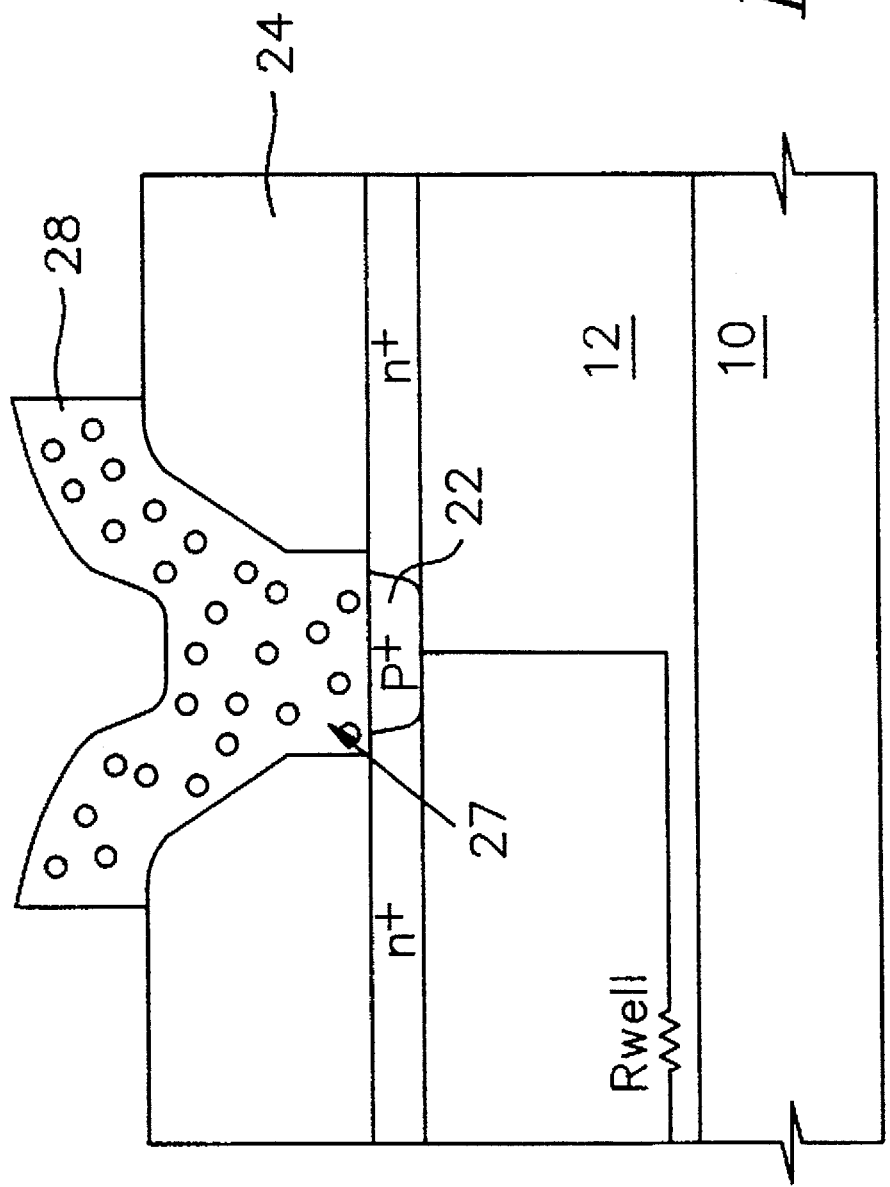

In the meantime, the collector grounding part (which is an area indicated as a reference numeral 22 in FIG. 4) for grounding the substrate (or well) and the cell grounding part (which is an area connected to the ground line 28 among areas indicated as a reference numeral 14 in FIG. 4) for grounding cell transistor had been formed in the same area in the prior art. However, according to the mask-ROM of the first embodiment of the present invention, the collector grounding part for grounding the substrate is formed around the BJT. The cell grounding part for grounding cell transistor is formed in the other side of the cell array. Thereby, a plurality of ON cells are selected and at the same time, a plurality of BJTs are activated. Therefore, in this case, even if a great deal of holes temporarily flow into the substrate (or well) 100, the holes are effectively grounded by the $P^+$ collector grounding part 110 formed around the BJT. Thus, it is possible to suppress the rise of the potential of the well or the semiconductor substrate, which is considered as a problem in the prior art NAND type mask-ROM.

Further, such ground can effectively be performed because the $P^+$ collector grounding part 110 is adjacently formed to the emitter of the BJT and a resist value $R_{WELL}$ between the $P^+$-type emitter 108 and the $P^+$ collector grounding part 110 becomes more low in the NAND type mask-ROM of the present invention than that of the prior art.

At the moment, since the $P^+$ collector grounding part 110 for grounding the hole which is excessively flowed through the BJT, as shown in FIG. 5, is formed in a redundant area between the BJTs, there is no need to have the area for forming the $P^+$ collector grounding part. Thus, a fact that the dimension of the cell array should be increased to form the $P^+$ collector grounding part 110, is not considered as a problem in the present invention.

Second Embodiment

Figure 9:
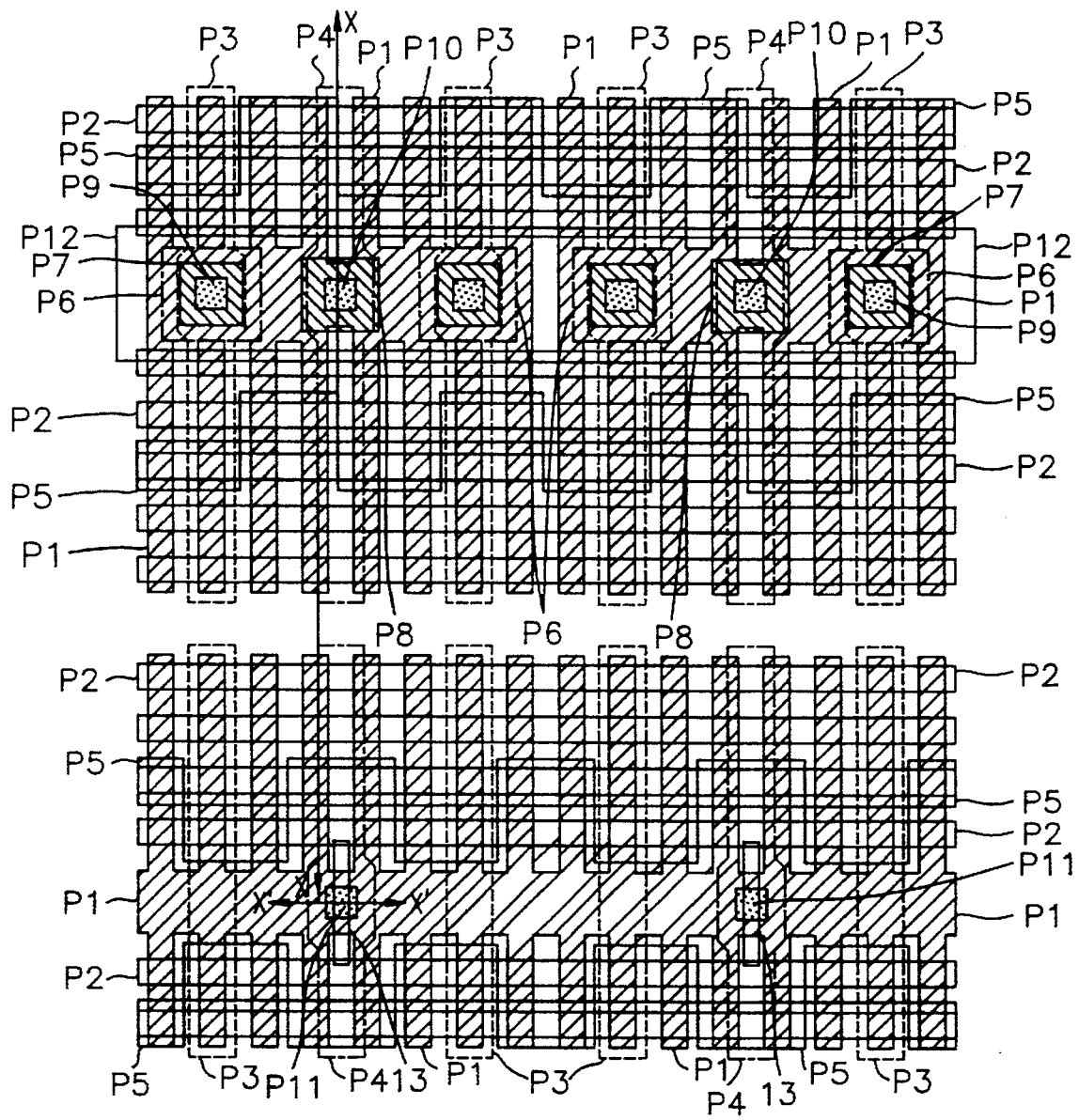
FIG. 9 shows a layout of the cell array of the NAND type mask-ROM according to a second embodiment of the present invention.

FIG. 9 shows a layout of the cell array of the NAND type mask-ROM according to the second embodiment of the present invention. The layout of FIG. 9 is the same as that of FIG. 5 except that the mask pattern P13 is added to partially fold together the mask pattern P11 in the mask pattern P4, the mask pattern P13 being used for forming the $P^+$ ion-implantation layer.

Figure 10A:
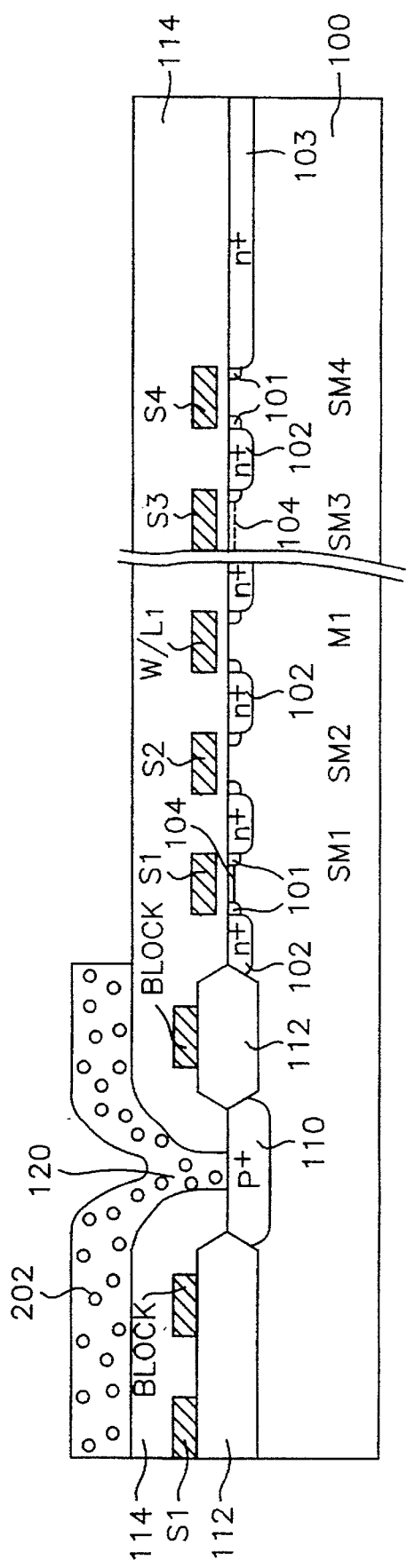
FIGS. 10A and 10B are cross sectional views taken along the lines X—X and X'—X' of FIG. 9.
Figure 10B:
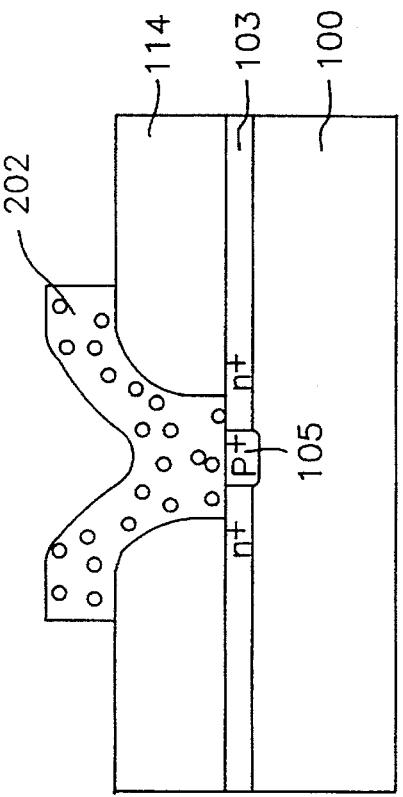

FIGS. 10A and 10B are cross sectional views taken along the lines X—X and X'—X', which are the same as FIG. 8 except that the $P^+$ ion-implantation layer 105 is added to the interior of the $N^+$ cell grounding part 103, the $P^+$ ion-implantation layer 105 being partially connected to the ground line 202.

According to the mask-ROM of the second embodiment of the present invention, the $P^+$ ion-implantation layer is additionally formed to the $N^+$ cell grounding part for grounding the source/drain of the cell transistor, so that there is provided a function of grounding the P-type well (or semiconductor substrate) in the mask-ROM.

Third Embodiment

Figure 11:
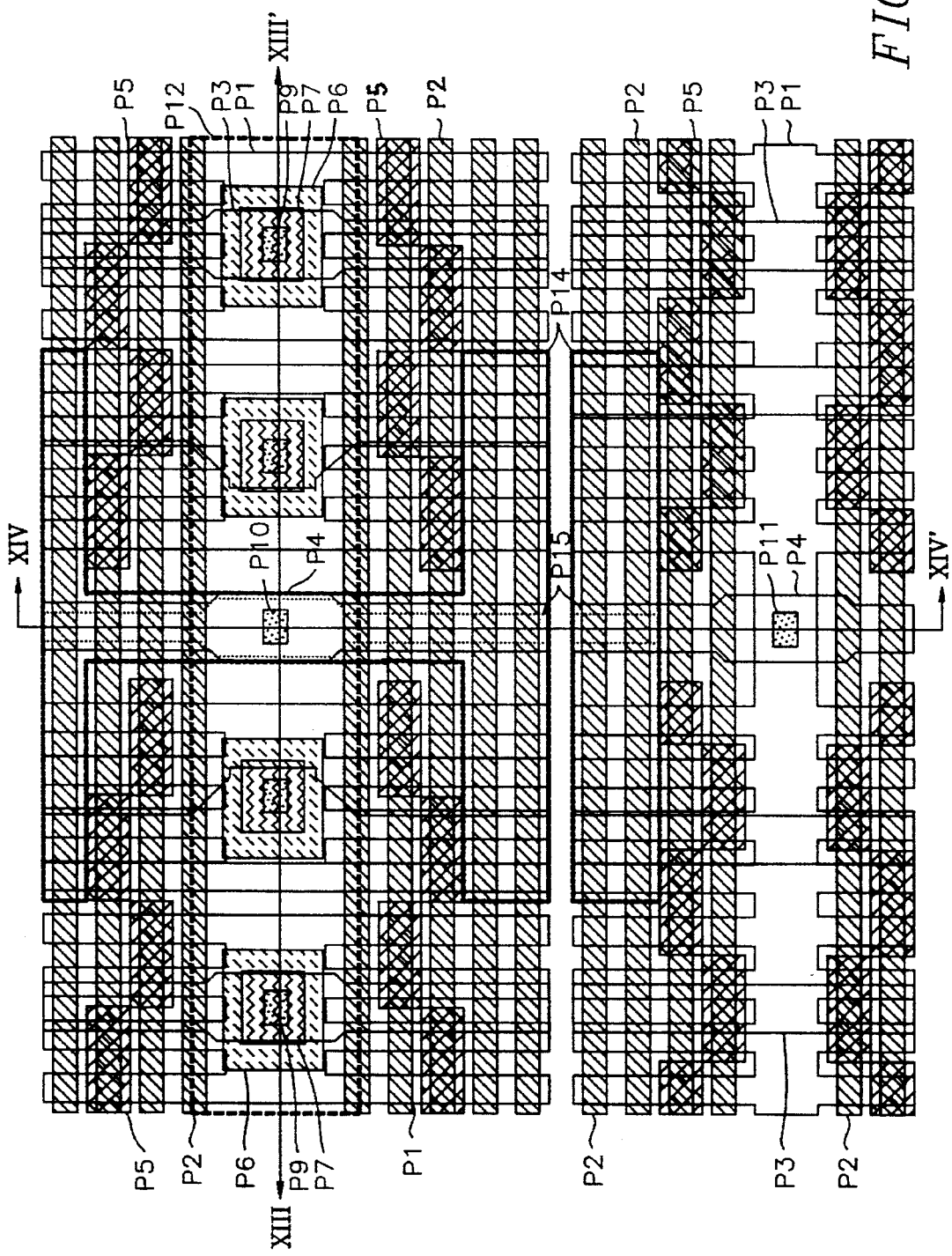
FIG. 11 shows a layout of the cell array of the NAND type mask-ROM according to a third embodiment of the present invention.

FIG. 11 shows a layout of the cell array of the NAND type mask-ROM according to the third embodiment of the present invention. A reference numeral "P14" indicates the mask pattern for implanting program cell ion, and a reference numeral "P15" indicates the mask pattern for forming the collector grounding part.

In the third embodiment of the present invention, the mask pattern P14 for forming the collector grounding part is formed along the mask pattern P4 for forming the ground line so that the collector grounding part has a shape lengthened along the ground line.

Figure 12:
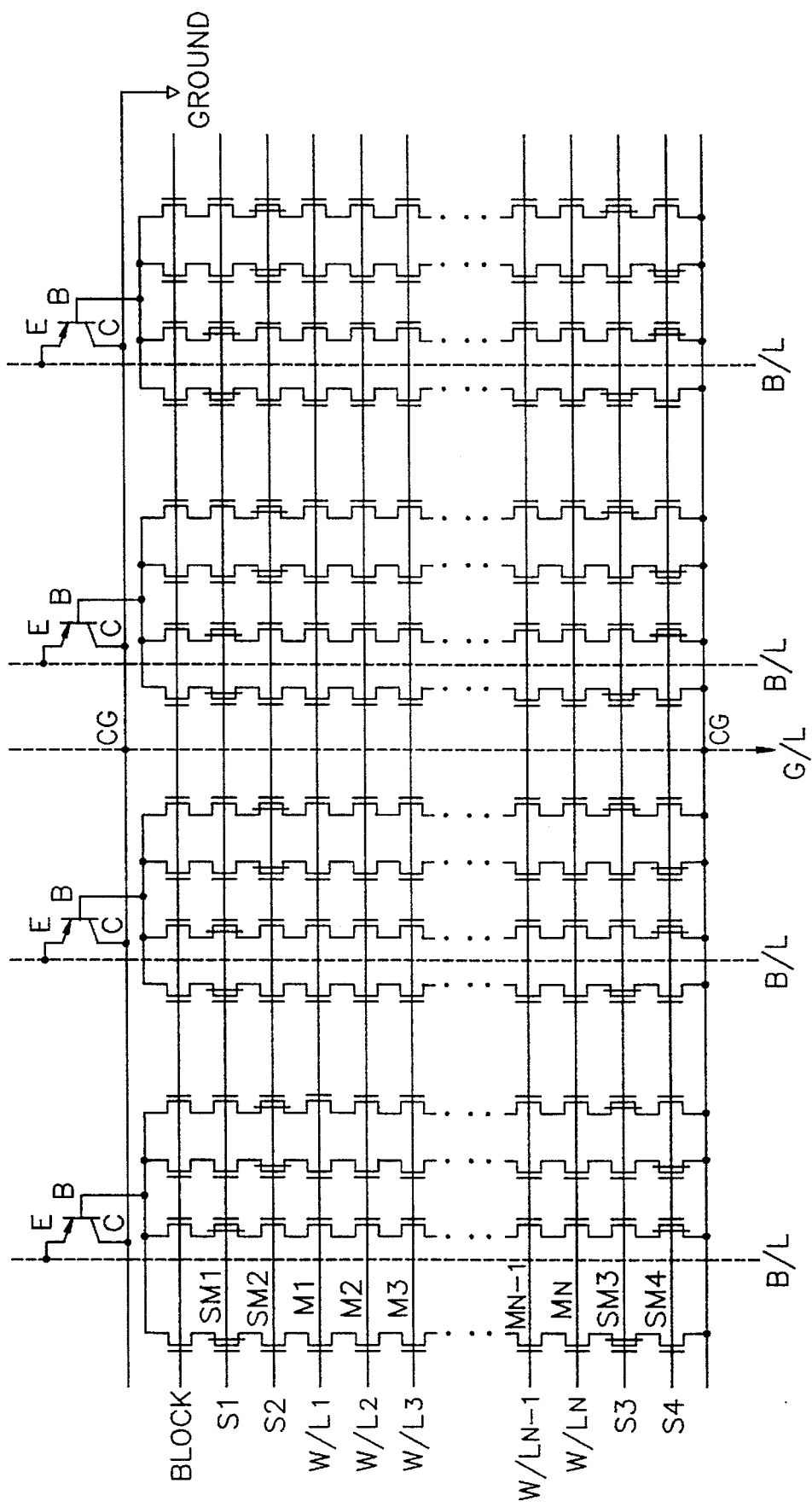
FIG. 12 is an equivalent circuit view of the NAND type mask-ROM of FIG. 11.

FIG. 12 is the equivalent circuit view of the NAND type mask-ROM of FIG. 11. In reference numerals of FIG. 12, the same ones as those of FIG. 9 indicate the same part in drawings.

Figure 13:
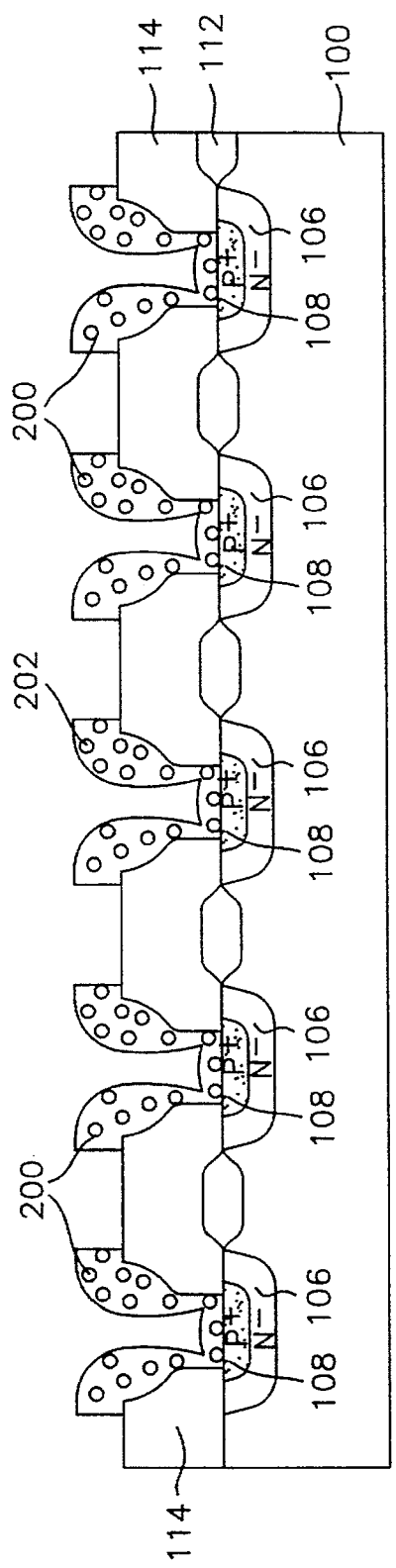
FIG. 13 is a cross sectional view taken along the line XIII–XIII' of FIG. 11.
Figure 14:
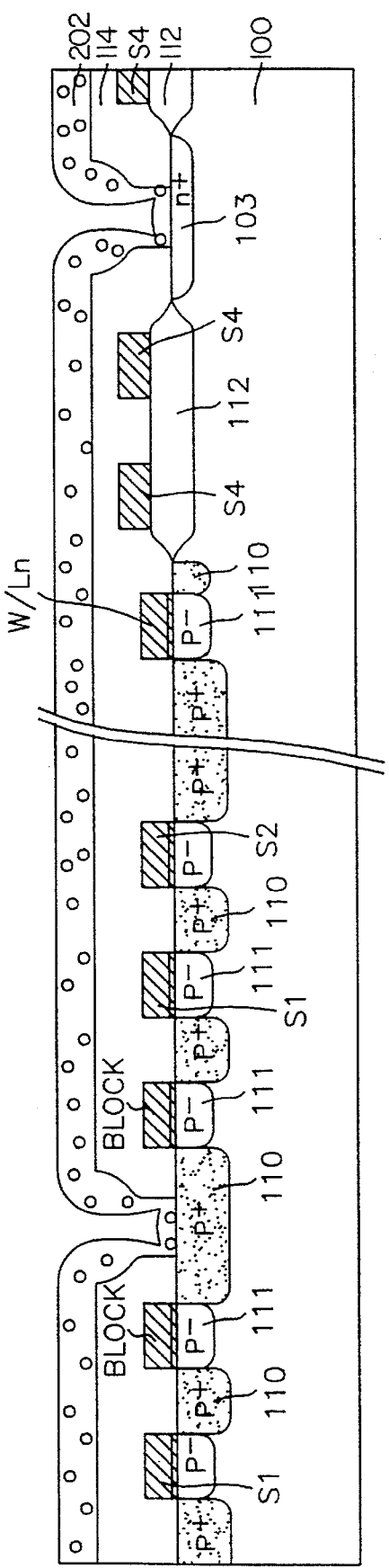
FIG. 14 is a cross sectional view taken along the line XIV–XIV' of FIG. 11.

FIG. 13 is the cross sectional view taken along the line XIII–XIII' of FIG. 11. FIG. 14 is the cross sectional view taken along the line XIV–XIV' of FIG. 11. In the reference numerals of FIG. 14, the same ones as those of FIGS. 7, 8, and 10 indicate the same parts.

Referring to FIGS. 13 and 14, the collector grounding part 110 is formed to extend up to an area in which the gate electrodes BLOCK, S1, S2, and $W/L_N$ ... are formed, as well as a peripheral area of the contact window for contacting with the ground line 202. At the moment, since the lower part 111 of the gate electrode is conducted as P-type by means of P-type impurity during the program cell ion-implantation, the resist of the collector grounding part should be lowered.

In the mask-ROM according to the third embodiment of the present invention, the dimension of the collector grounding part can more extend than that of the collector grounding part according to the first and second embodiments, so that it is possible to more effectively ground the hole which flows into the BJT and also is possible to increase the cut-off frequency and the maximal current driving capacity.

Figure 15:
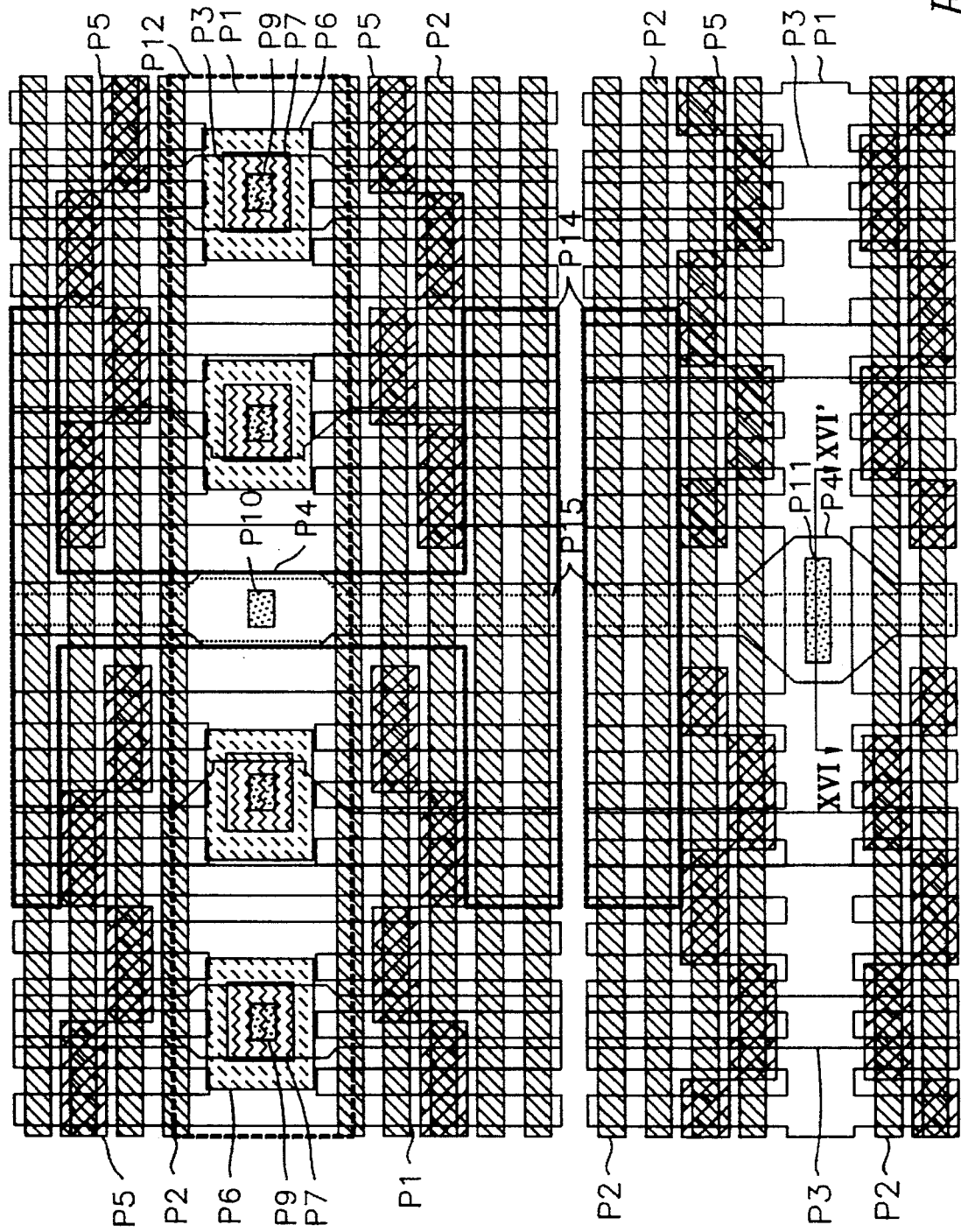
FIG. 15 shows a layout of the cell array of the NAND type mask-ROM according to a fourth embodiment of the present invention.

FIG. 15 shows a layout of the cell array of the NAND type mask-ROM according to the fourth embodiment of the present invention. The layout of FIG. 15 is the same as that of FIG. 11, except that the mask pattern P15 for forming the collector grounding part is extended thereto.

Figure 16:
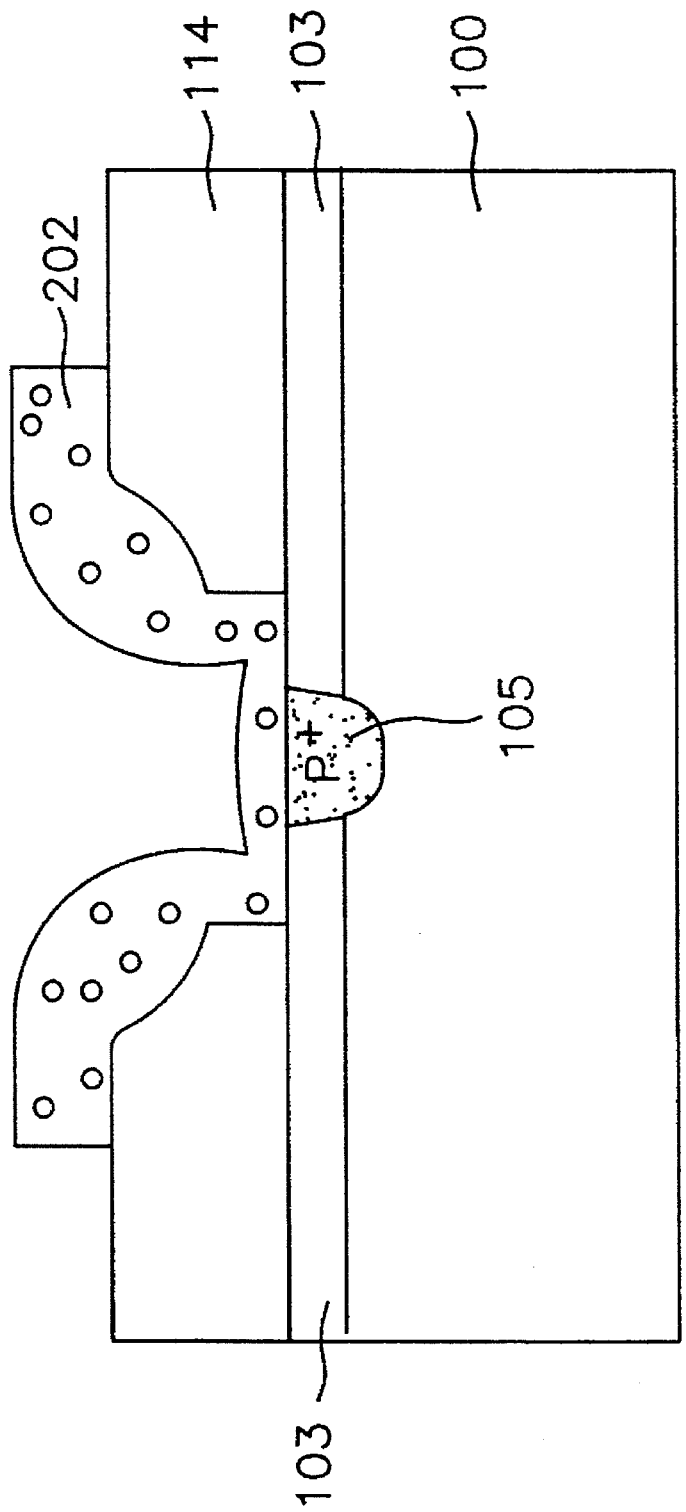
FIG. 16 is an equivalent circuit view taken along the line XVI–XVI' of FIG. 15.

FIG. 16 is the cross sectional view taken along the line XVI–XVI' of FIG. 15, which is the same as FIG. 14 except that $P^+$ collector grounding part 105 connected partially to the ground line 202 is added to the cell grounding part 103.

In the mask-ROM according to the fourth embodiment of the present invention, the $P^+$ collector grounding part is extended up to the $N^+$ cell grounding part for grounding the source/drain of the cell transistor, so that it is possible to more effectively ground the P-type well (or semiconductor substrate).

According to the mask-ROM of the present invention, the collector contacting part for grounding the collector of the BJT and the P-type well is formed around the BJT, and a ground line contacting part for grounding the $N^+$-type impurity diffusion layer is formed in the other side of the cell array. Thereafter, the two contacting pans are connected to each other through one ground line, thereby grounding a great deal of holes flowing temporarily into the P-type well (or P-type semiconductor substrate). Thus, it is possible to suppress the rise of the potential of the P-type well and the above problems can therefore, be solved.

It is well known to one skilled in the prior art that the scope of the technique of the present invention is effectively applied to the semiconductor memory device, for example, DRAM or SRAM, having the cell array in which a plurality of bit lines and a plurality of word lines are crossed to each other, even if the technical scope of the present invention is only applied to the mask-ROM in the embodiments of the present invention.

Accordingly, various modifications may be without departing from the spirit or scope of the general inventive concept as defined by the appended claims and their equivalents.

What is claimed is:

1. A current amplification type mask-ROM, comprising:
   a plurality of bipolar junction transistors;
   a collector grounding part disposed in each of said plurality of bipolar junction transistors; and
   a ground line for connecting a plurality of said collector grounding parts to a cell grounding part formed in one end of a cell array;

wherein each of said collector grounding parts is connected to a collector of a respective one of said bipolar junction transistors, and said cell grounding part is connected to a source/drain of a cell transistor.

2. A current amplification mask-ROM as claimed in claim 1, wherein the thickness of impurity of said collector grounding part is higher than that of impurity of said collector.

3. A current amplification mask-ROM as claimed in claim 2, wherein said cell grounding part partially includes an impurity area which is connected to said collector of said bipolar junction transistor and also is partially connected to said ground line.

4. A current amplification type mask-ROM, comprising:

a plurality of bipolar junction transistors;

a collector grounding part disposed in each of said plurality of bipolar junction transistors; and a ground line for connecting a plurality of said collector grounding parts to a cell grounding part formed in one end of a cell array;

wherein said collector grounding part is a square having a size similar to a base of said bipolar junction transistor.

5. A current amplification mask-ROM as claimed in claim 4, wherein impurity layer of low thickness is formed in between said collector grounding part and said base of said bipolar junction transistor, said impurity layer being conducted as the equal type to said base.

6. A current amplification type mask-ROM, comprising:

a plurality of bipolar junction transistors;

a collector grounding part disposed in each of said plurality of bipolar junction transistors; and a ground line for connecting a plurality of said collector grounding parts to a cell grounding part formed in one end of a cell array;

wherein said collector grounding part has a shape lengthened along said ground line.

7. A current amplification mask-ROM as claimed in claim 6, wherein said collector grounding part has a part of a depletion channel of said cell transistor.

8. A current amplification mask-ROM as claimed in claim 1, wherein said bipolar junction transistor is a PNP-type one, and said cell transistor is an NMOS-type one.

9. A current amplification mask-ROM as claimed in claim 8, wherein said source/drain is formed by a configuration LDD (Lightly Doped Drain).

* * * * *